(12) United States Patent
Guan et al.

(10) Patent No.: US 11,500,014 B2
(45) Date of Patent: Nov. 15, 2022

(54) CURRENT SENSOR AND METHOD FOR SENSING A STRENGTH OF AN ELECTRIC CURRENT

(71) Applicant: Infineon Technologies AG, Neubiberg (DE)

(72) Inventors: Lifeng Guan, Singapore (SG); Wai Keung Frankie Chan, Singapore (SG); Adrian Gan, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 112 days.

(21) Appl. No.: 16/996,105

(22) Filed: Aug. 18, 2020

(65) Prior Publication Data
US 2021/0072309 A1 Mar. 11, 2021

(30) Foreign Application Priority Data
Sep. 11, 2019 (DE) .......................... 102019124396.3

(51) Int. Cl.
G01R 31/30 (2006.01)
G01R 31/317 (2006.01)
G01R 31/327 (2006.01)
G01R 31/14 (2006.01)
G01R 1/067 (2006.01)

(52) U.S. Cl.
CPC ......... *G01R 31/3004* (2013.01); *G01R 1/067* (2013.01); *G01R 31/14* (2013.01); *G01R 31/31702* (2013.01); *G01R 31/3274* (2013.01)

(58) Field of Classification Search
None
See application file for complete search history.

(56) References Cited

U.S. PATENT DOCUMENTS

| 11,035,887 | B2* | 6/2021 | Bilbao De Mendizabal ............... G01R 15/207 |
| 11,239,761 | B2* | 2/2022 | Aichriedler ........... H02M 7/003 |
| 2013/0162245 | A1 | 6/2013 | Tamura |
| 2014/0300349 | A1* | 10/2014 | Walker ............... G01R 19/0092 324/207.25 |
| 2018/0149677 | A1* | 5/2018 | Milano ............. G01R 19/0092 |
| 2019/0025346 | A1* | 1/2019 | Latham .................. F04B 49/06 |
| 2019/0079142 | A1 | 3/2019 | Close et al. |

(Continued)

FOREIGN PATENT DOCUMENTS

EP 3185019 A1 6/2017

*Primary Examiner* — Jermele M Hollington
(74) *Attorney, Agent, or Firm* — Harrity & Harrity, LLP

(57) ABSTRACT

Examples relate to a current sensor and to a method for sensing a strength of an electric current using two groups of magnetic sensing probes. The current sensor includes a first group and a second group of magnetic sensing probes. The current sensor comprises sensor circuitry coupled to the first and the second group of magnetic sensing probes. The sensor circuitry is configured to determine a first differential magnetic field measurement of a magnetic field using probes of the first group of magnetic sensing probes. The sensor circuitry is configured to determine a second differential magnetic field measurement of the magnetic field using probes of the second group of magnetic sensing probes. The sensor circuitry is configured to determine a strength of the electric current based on a difference between the first differential magnetic field measurement and the second differential magnetic field measurement.

22 Claims, 5 Drawing Sheets

(56) References Cited

U.S. PATENT DOCUMENTS

2019/0107585 A1\* 4/2019 Huber Lindenberger ................... G01R 33/0035
2019/0229640 A1\* 7/2019 Aichriedler ............. H02P 27/06

\* cited by examiner

CURRENT SENSOR AND METHOD FOR SENSING A STRENGTH OF AN ELECTRIC CURRENT

RELATED APPLICATION

This application claims priority to German Application No. 102019124396.3 filed Sep. 11, 2019, which is incorporated herein by reference in its entirety.

FIELD

Examples relate to sensor systems, more specifically to a current sensor and to a method for sensing a strength of an electric current using two groups of magnetic sensing probes.

BACKGROUND

A Hall Effect sensor (or Hall sensor) can sense a magnetic field by generating a voltage that varies in response to a magnetic field. However, the accuracy of a Hall sensor can be influenced by interference of a stray magnetic field, which may be caused by a conductor being arranged in proximity of the conductor carrying the current to be measured.

SUMMARY

There may be a demand for providing an improved concept for a current sensor.

Such a demand may be satisfied by the subject matter of any of the claims.

Some embodiments relate to a current sensor for sensing a strength of an electric current. The current sensor includes a first and a second group of magnetic sensing probes. The current sensor includes sensor circuitry coupled to the first and second group of magnetic sensing probes. The sensor circuitry is configured to determine a first differential magnetic field measurement of a magnetic field using probes of the first group of magnetic sensing probes. The magnetic field is caused by an electric current to be measured. The sensor circuitry is configured to determine a second differential magnetic field measurement of the magnetic field using probes of the second group of magnetic sensing probes. The sensor circuitry is configured to determine a strength of the electric current to be measured based on a difference between the first differential magnetic field measurement and the second differential magnetic field measurement.

Some embodiments relate to a method for sensing a strength of an electric current. The method includes determining a first differential magnetic field measurement of a magnetic field using probes of a first group of magnetic sensing probes. The magnetic field is caused by an electric current to be measured. The method includes determining a second differential magnetic field measurement of the magnetic field using probes of a second group of magnetic sensing probes. The method includes determining a strength of the electric current to be measured based on a difference between the first differential magnetic field measurement and the second differential magnetic field measurement

BRIEF DESCRIPTION OF THE DRAWINGS

Some examples of apparatuses and/or methods will be described in the following by way of example only, and with reference to the accompanying figures, in which.

DETAILED DESCRIPTION

Figure 1:
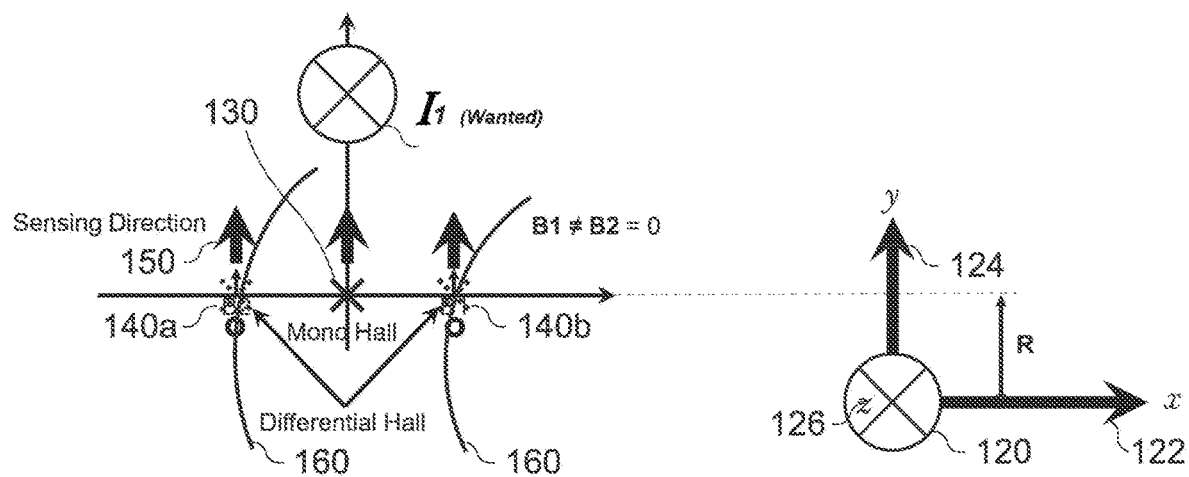
FIG. 1 shows a schematic diagram of an influence of an interference (magnetic field) source in Hall-based current measurement.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

In sensor devices, different approaches are adopted to measure a strength of an electric current. For example, in some cases, a shunt resistor is used. Alternatively, magnetic sensing devices may be used to measure the magnetic field generated by a current, and thus the strength of the current. Mono Hall current sensors and differential Hall current sensors are two types of sensor devices that employ the magnetic sensing principle for current measurement. In some cases, a stray magnetic field, e.g. caused by a source of interference, such as another conductor that is arranged in close proximity, may distort the current sensed by such current sensors. For example, the stray magnetic field may generate noise at the sensor output.

FIG. 1 shows a schematic diagram of an influence of an (magnetic field) interference source in Hall-based current measurement. In FIG. 1, the current $I_1$ to be measured is denoted by reference sign 110, the interference current is denoted by reference sign 120. FIG. 1 further shows a mono Hall sensor 130 and a differential Hall sensor 140a; 140b, which have a sensing direction 150 towards the current $I_1$ to be measured. Reference sign 160 denotes the stray magnetic field. Hall-based current sensors detect the stray magnetic field projected to their sensing axis. A stray magnetic field generated by an external current path (e.g. interference current 120) may be considered an interference source. The external current path can be decomposed into projections on x, y and z direction, with reference sign 122 denoting the x-direction, 124 denoting the y-direction and 126 denoting the z-direction. In the setup of FIG. 1, a magnetic flux density B1 measured with a first Hall probe 140a of the differential current sensor may be different from a magnetic flux density B2 measured with a second Hall probe 140b of the differential current sensor.

For the x-direction current flow, the differential probes may cancel the stray field as they are located on the same concentric cylinder surface of the magnetic field. For the y-direction current flow, the generated magnetic field may be perpendicular to the sensing direction and therefore, zero magnetic field may be seen by the sensing probes. For the z-direction current, the magnetic field generated may be detectable by the sensing probes and cannot be offset by a single differential concept and therefore considered as interference. Therefore, the discussion below may at least partially focus on this type of interference. At least some embodiments may be aimed at suppressing interference generated by a stray magnetic field in a magnetic sensor based current measurement, for example in a three-phase drive high current measurement.

A mono Hall current sensors might not be able to cancel the noise by itself or to provide any further information for the system to do noise cancellation. Differential Hall current sensors may have limited common mode stray field suppression, if the field source is very close to the sensor, because the Hall probes in the integrated circuit are located in physical different position and measure different level of stray field strength. Therefore, differential current measurement may provide a common mode interference suppression, up to a certain extent (with wanted current and interference current at certain minimal distance). At lower distances and/or high currents, however, the stray magnetic field may cause a discernible ripple in the current measurement. For example, in a test setup, a ripple of approx. 5% was observed when a conductor being used to conduct 400 A of current was placed at a distance of 5 cm from the Hall probes. For an interfering current that generates a stray magnetic field to the sensor, the higher the current and/or closer distance between the interfering current to the sensor, the higher interference will be present at the sensor output. A differential Hall current sensor may thus be able to cancel the common mode stray field when the source of the stray magnetic field is far away from the sensor but might not be able cancel such common mode interference when the source of the stray magnetic field is close to the sensor. For a three-phase driving application, a complicated calibration method may be involved in a microcontroller unit to solve a 3×3 matrix (as shown below) apart from careful mechanical installation of the bus bar.

Figure 2:
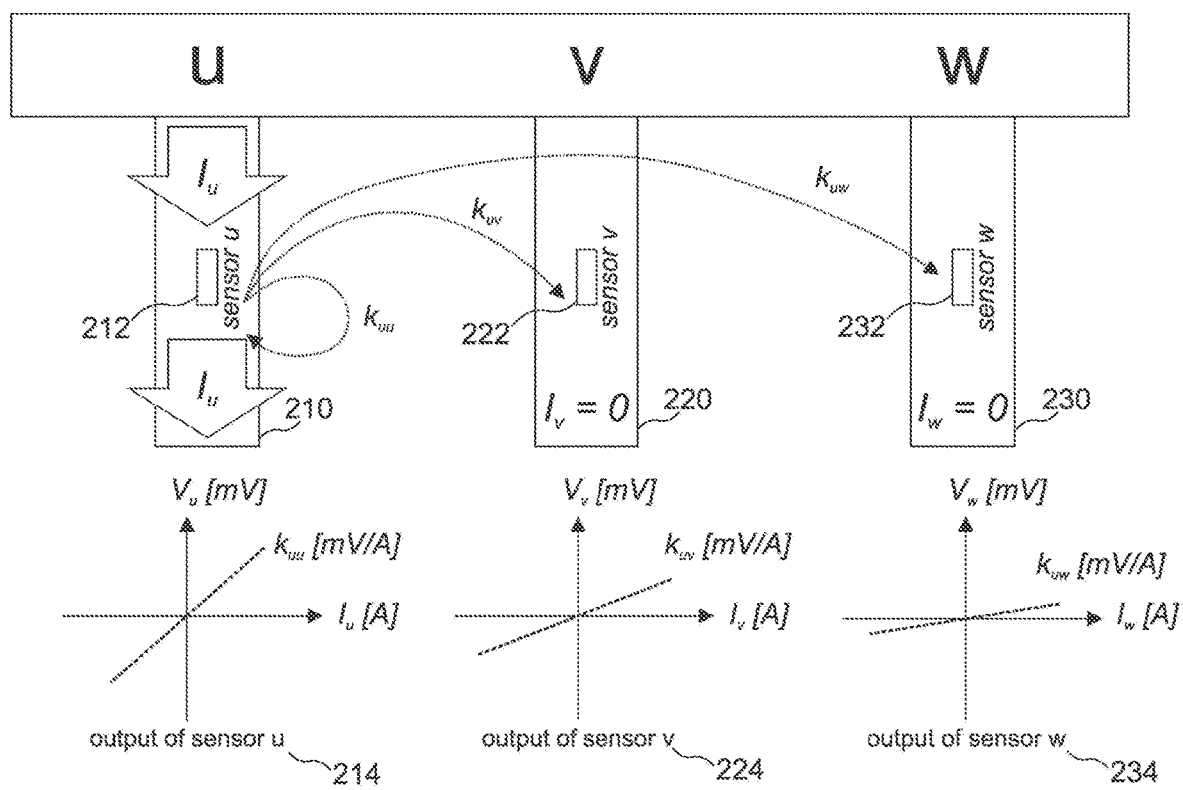
FIG. 2 shows a schematic diagram of a three-phase current measurement application.

FIG. 2 shows a schematic diagram of a three-phase current measurement application, in which cross talk between the three bus bars 210, 220 and 230 is illustrated. $I_u$, $I_v$ and $I_w$ denote the currents running through the bus bars 210, 220 and 230 respectively, which are measured by sensor$_u$ 212, sensor$_v$ 222, and sensor$_w$ 232. Each sensor also can detect other currents that are in different bus bars if crosstalk is not small (e.g. due to a narrow distance between bus bars). In the example of FIG. 1, only $I_u$ is larger than zero, so only crosstalk $k_{uu}$ (on sensor$_u$), $k_{uv}$ (on sensor$_v$) and $k_{uw}$ (on sensor$_w$) is applied, the first letter of the suffix denoting the source of the crosstalk (u in all cases) and the second letter of the suffix denoting the destination of the crosstalk (u, v, and w, respectively). Diagrams 214, 224 and 234 show the outputs of the respective sensors. The x-axis denote the current $I_u$ in Ampere, the y-axes show the voltage measured $V_u$, $V_v$ and $V_w$ measured at the respective sensors (in mV).

To mitigate the crosstalk, a calibration of the sensor may be performed. Due to crosstalk, the current sensor output voltage at each sensor u, v, and w may be defined by V'=K·I, with K representing the crosstalk. Each of the factors may be described in matrix form:

$$\begin{bmatrix} V'_u \\ V'_v \\ V'_w \end{bmatrix} = \begin{bmatrix} k_{uu} & k_{vu} & k_{wu} \\ k_{uv} & k_{vv} & k_{vw} \\ k_{uw} & k_{vw} & k_{ww} \end{bmatrix} \begin{bmatrix} I_u \\ I_v \\ I_w \end{bmatrix}$$

The aim of the cross talk calibration process may be to obtain the K matrix and provide it to an inverter module. To get each compensated current value in run time, the following matrix multiplication may be employed (using the inverse of the K matrix)

$$\begin{bmatrix} I_u \\ I_v \\ I_w \end{bmatrix} = \begin{bmatrix} k_{uu} & k_{vu} & k_{wu} \\ k_{uv} & k_{vv} & k_{vw} \\ k_{uw} & k_{vw} & k_{ww} \end{bmatrix}^{-1} \begin{bmatrix} V'_u \\ V'_v \\ V'_w \end{bmatrix}$$

(I=K$^{-1}$·V'), with I being the compensated current value, K$^{-1}$ being the pre-defined cross talk matrix, and V' being the measured voltages from the sensors. Especially in a three-phase current measurement, a complicated calibration method may be involved to measure the phase current accurately.

Embodiments of the present disclosure may provide an approach for current sensor that may be used as an alternative (or in addition) to the calibration approach, which may provide an improved concept for a current sensor.

Figure 3:
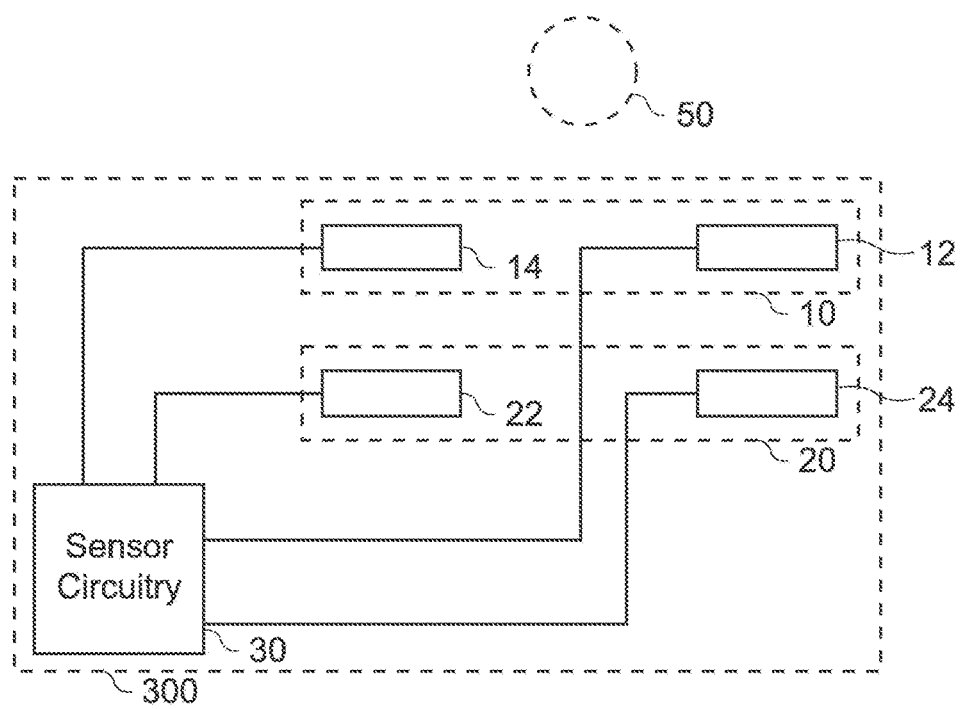
FIG. 3 shows a schematic cross section of an embodiment of a current sensor for sensing a strength of an electric current.

FIG. 3 shows a schematic cross section of an embodiment of a current sensor 300 for sensing a strength of an electric current. The current sensor comprises a first 10 and a second 20 group of magnetic sensing probes. For example, the magnetic sensing probes may be Hall probes, i.e. the first 10 and second 20 group of magnetic sensing probes may be a first and a second group of Hall probes. The current sensor 300 further comprises sensor circuitry 30 coupled to the first and second group of magnetic sensing probes. The sensor circuitry 30 is configured to determine a first differential magnetic field measurement of a magnetic field using probes 12; 14 of the first group 10 of magnetic sensing probes. The magnetic field is caused by an electric current to be measured. The sensor circuitry 30 is configured to determine a second differential magnetic field measurement of the magnetic field using probes 22; 24 of the second group 20 of magnetic sensing probes. The sensor circuitry is configured to determine a strength of the electric current to be measured based on a difference between the first differential magnetic field measurement and the second differential magnetic field measurement. FIG. 3 further shows a conductor 50 that is carrying the current to be measured.

By determining the strength of the electric current to be measured based on the difference between the first differential magnetic field measurement and the second differential magnetic field measurement, embodiments may significantly improve the sensor signal output signal-to-noise-ratio (SNR) compared to single differential current sensors. Furthermore, embodiments may provide a higher sensor signal availability due to full redundancy, as during fault of one group of current sensor, a reduced operation is possible by another symmetric group of the current sensor. Additionally, in some current sensors, no sensing module level calibration may be required because device level EOL (End of Line) calibration may be deemed good enough, which may improve the ease-of-use of the device. Embodiments may be used in current sensors that feature stray field robustness, fail operation capability, and ISO26262 compliance. Embodiments may simplify the inter-bus-bar calibration procedure to achieve accurate current measurement results in three-phase driving system phase current measurements.

Embodiments of the present disclosure relate to current sensors, e.g. to current sensors 300, 400 and 500 of FIGS. 3 to 5*b*. In embodiments, the current sensors may be Hall-effect based current sensors, i.e. current sensors that rely on the Hall-effect to determine a strength of the electric current to be measured. In Hall-effect based current sensors, such as the current sensors 300, 400 and/or 500 according to some embodiments, in general, one or more voltages are generated (and measured) that vary with a magnetic flux density of a magnetic field measured using the magnetic sensing probes of the Hall-effect based current sensor. The magnetic field measured using the magnetic sensing probes of the Hall-effect based current sensor may, in turn, be (at least partially) caused by the current to be measured, so that the one or more voltages that are measured are indicative of the current strength of the current to be measured. While the present application focuses on Hall sensors in the description, the concept of dual-differential sensing may be applied to all magnetic sensing technologies including Hall, GMR (Giant Magneto-Resistance), AMR (Anisotropic Magneto-Resistance) and TMR (Tunnel Magneto-Resistance) technologies without prejudice.

Embodiments are further based on differential measurement principles: Within a group of magnetic sensing probes, the sensor circuitry measures the magnetic field at (at least) two places, using (at least) two sensor probes of the group of sensor probes, and subtracts one from the other. The differential magnetic field measurement may be taken from voltages being measured at the different magnetic sensing probes. For example, a differential magnetic field measurement may be based on a difference measured between a voltage measured using a first magnetic sensing probe of a group of magnetic sensing probes and a voltage measured using a second magnetic sensing probe of the group of magnetic sensing probes. Such a differential magnetic field measurement may be taken by the processing circuitry for each group of magnetic sensing probes.

The current sensor comprises the first 10 and the second 20 group of magnetic sensing probes. The groups may be static—at any time, a magnetic sensing probe is assigned to either the first 10 or the second 20 group of magnetic sensing probes. The groups of magnetic sensing probes are used to take a further differential measurement, which is based on the difference between the first differential magnetic field measurement and the second differential magnetic field measurement. In other words, the sensor circuitry 30 may be configured to determine a further differential magnetic field measurement based on the difference between the first differential magnetic field measurement and the second differential magnetic field measurement. In the context of this application, a differential magnetic field measurement might not necessarily be a measurement per se, but rather a value that is generated based on a measurement or a value that represents a measurement. Using the further differential magnetic field measurement, the current strength of the electric current to be measured may be determined. For example, the further differential magnetic field measurement, or the difference between the first differential magnetic field measurement and the second differential magnetic field measurement, may be multiplied by a conversion factor or used as input to a conversion function to determine the current strength of the electric current to be measured.

In embodiments, two groups of magnetic sensing probes are used. As the term "groups" implies, each group comprises two or more magnetic sensing probes, which are used to determine the respective differential magnetic field measurement. In at least some embodiments, e.g. the embodiments of FIGS. 3, 4 and 5*a*/5*b*, the first 10 and the second 20 group of magnetic sensing probes each comprise (exactly) two magnetic sensing probes 12; 14; 22; 24. Two magnetic sensing probes per group may suffice to perform the differential measurement. Accordingly, the first differential magnetic field measurement may be determined using the two magnetic sensing probes 12; 14 of the first group 10 of magnetic sensing probes. The second differential magnetic field measurement may be determined using the two magnetic sensing probes 22; 24 of the second 20 group of magnetic sensing probes. In some other embodiments, a larger amount of magnetic sensing probes may be used for each group of magnetic sensing probes, e.g. at least three or at least four.

In at least some embodiments, the magnetic sensing probes may be aligned. Each group of (two) magnetic sensing probes may be vertically stacked onto another group of (two) magnetic sensing probes. Each magnetic sensing probe may be aligned with the corresponding magnetic sensing probe in another group. The two magnetic sensing probes within each group may be laterally (i.e. horizontally) aligned. For example, the magnetic sensing probes of a group of magnetic sensing probes may be laterally aligned. In other words, the magnetic sensing probes of a group of magnetic sensing probes may be arranged at the same vertical position, and at different lateral positions. Furthermore, each magnetic sensing probe of the first group of magnetic sensing probes may be vertically aligned (i.e. at the same lateral position and at a different vertical position) with a (corresponding) magnetic sensing probe of the second group of magnetic sensing probes. For example, in FIGS. 3 to 5*b*, the magnetic sensing probes 12 and 14 of the first group of magnetic sensing probes is horizontally aligned, as are the magnetic sensing probes 22 and 24 of the second group of magnetic sensing probes. Furthermore, magnetic sensing probe 12 of the first group is vertically aligned with magnetic sensing probe 24 of the second group, and magnetic sensing probe 14 of the first group is vertically aligned with magnetic sensing probe 22. Alternatively, a different arrangement may be used, for example an arrangement that is not (vertically or laterally) aligned and/or an arrangement that is asymmetric.

In embodiments the sensor circuitry 30 may be implemented using one or more processing circuitry units, one or more processors, one or more processing units or any means for processing, such as a processor or a programmable hardware component being operable with accordingly adapted software. In other words, the described function of the control module 30 may as well be implemented in software, which is then executed on one or more programmable hardware components. Such hardware components may comprise a general purpose processor, a Digital Signal Processor (DSP), a micro-controller, etc. For example, the sensor circuitry may be implemented in a (e.g. at least one) die used to implement the hall probes.

For example, the vertical direction and a vertical dimension may be measured orthogonal to a front side surface of a die that implements the hall sensors of at least one group of hall sensors, and a lateral direction and lateral dimensions may be measured in parallel to the front side surface of the die.

Figure 4:
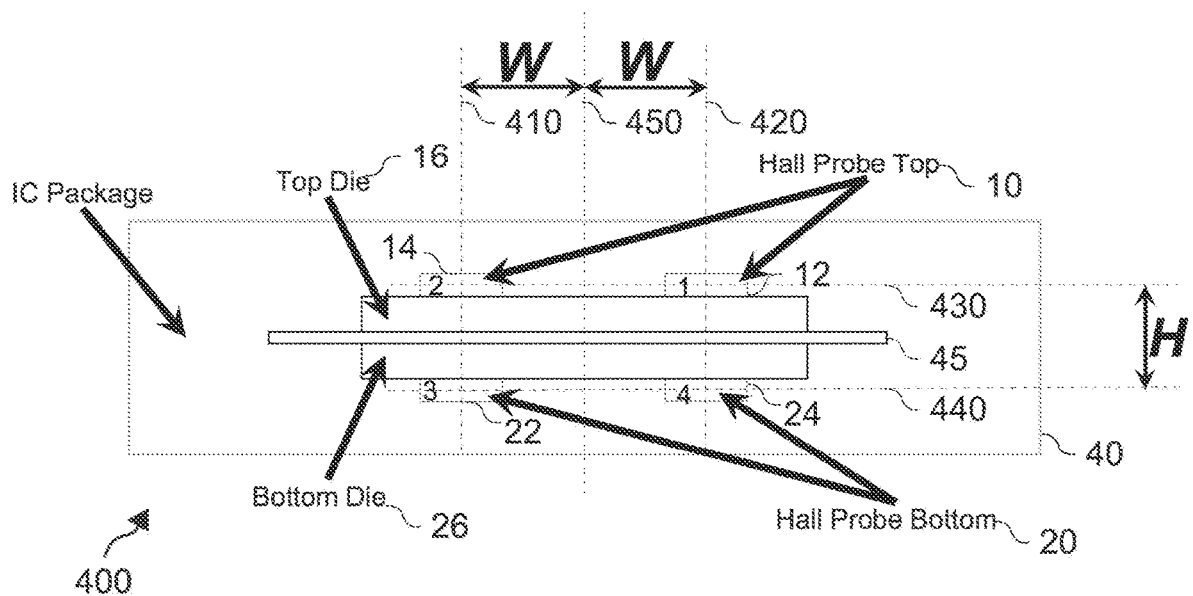
FIG. 4 shows a schematic cross section of a further embodiment of a current sensor, in which a package of the current sensor is shown.

FIG. 4 shows a schematic cross section of a further embodiment of a current sensor 400 for sensing a strength of an electric current. For example, the current sensor 400 may be implemented similar to the current sensor 300 of FIG. 3. FIG. 4 further shows the current sensor 400 comprising a package 40, the package 40 comprising a substrate 45. The package 40 may comprise the first and second group of magnetic sensing probes and the sensor circuitry 30. The current 400 further comprises two dies 16; 26, which are arranged at the substrate 45 of the package 40. For example, the current sensor 400 comprises a first die 16, and a second die 26. As shown in FIG. 4, the first die 16 and the second die 26 may be arranged vertically adjacent to each other. For example, as further shown in FIG. 4, the first 16 and the second 26 die may be arranged at opposite sides of the substrate 45 of the package 40. This may yield a symmetric arrangement of the components within the current sensor. Alternatively, the first 16 and the second 26 die may be stacked (directly) on top of each other, which may enable a thinner construction of the current sensor. As shown in FIG. 4, the dies may be horizontally aligned with each other within the current sensor, enabling a symmetric arrangement of the components within the current sensor. Alternatively, the dies may be horizontally offset, e.g. to enable current sensors that fit into constrained spaces. In some other embodiments, (all of) the magnetic sensing probes may be implemented on the same die, e.g. at opposite sides of the same die. In other words, the first and second group of magnetic sensing probes may be implemented on the same die, so that only a single die might be required.

FIG. 4 may show a side view of an integrated circuit of the current sensor. The proposed dual differential current measurement may use a current sensor with four magnetic sensing probes 12; 14; 22; 26 placed in such a way that the four magnetic sensing probes are formed into two groups 10; 20, with each group containing two magnetic sensing probes. As shown in FIG. 4, the first group 10 of magnetic sensing probes (denoted "Hall probe top") may be implemented on the first die 16 (denoted "top die"). The second group 20 of magnetic sensing probes (denoted "Hall probe bottom") may be implemented on the second die 26 (denoted "bottom die"). In other words, one of the dies 16; 26 may be a "top die" and the other of the dice 16; 26 may be the "bottom die".

For example, the die 16; 26 may be formed to present the respective magnetic sensing probes at a surface of the respective dies. In general, the magnetic sensing probes of each group may be displayed laterally spaced from each other by a center distance of 2 W. The magnetic sensing probes 12; 14 of the first group 10 may be disposed laterally spaced from each other on the first die 16. The magnetic sensing probes 22; 24 of the second group 20 may be disposed laterally spaced from each other on the second die 26. In FIG. 4, the lateral center of magnetic sensing probes 14; 22 is denoted by a vertical line 410, the lateral center of magnetic sensing probes 12; 24 is denoted by vertical line 420, the vertical center of the magnetic sensing probes 12; 14 of the first group 10 of magnetic sensing probes is denoted by horizontal line 430, and the vertical center of the magnetic sensing probes 22; 24 of the second group 20 of magnetic sensing probes is denoted by horizontal line 440. The distance between the lateral center of magnetic sensing probes 14; 22 and the lateral center of magnetic sensing probes 12; 24 in FIG. 4 is 2 W, and the distance between the vertical center of magnetic sensing probes 12; 14 and the vertical center of magnetic sensing probes 22; 24 is H. In other words, each group of two magnetic sensing probes may be placed in one die in the sensor package with horizontal separation of 2 W while the two dies may be stacked vertically, e.g. so that each single magnetic sensing probe in one die is vertically aligned to each magnetic sensing probe in another die with a vertical separation of H. The magnetic sensing probes are centered around a vertical center line 450, which has a vertical distance of W to (all of) the magnetic sensing probes. A conductor that is used to conduct the current to be measured may be arranged at the vertical center line, extending into a z-direction of the schematic cross section of FIG. 4.

The output signal for each die may apply the differential principle. In other words, the two groups of magnetic sensing probes may yield differential magnetic field measurements as outputs, e.g. the first differential magnetic field measurement $V_{21}$ and the second differential magnetic field measurement $V_{43}$ where $V_{ij}=V_i-V_j$ and $V_i$ is the voltage representation of absolute magnetic value for each magnetic sensing probe in the sensor device. In the formulae, the voltage measured using magnetic sensing probe 12 may be denoted $V_1$, the voltage measured using magnetic sensing probe 14 may be denoted $V_2$, and the first differential magnetic field measurement may be denoted $V_{21}$. The voltage measured using magnetic sensing probe 22 may be denoted $V_3$, the voltage measured using magnetic sensing probe 24 may be denoted $V_4$, and the second differential magnetic field measurement may be denoted $V_{43}$. A further differential magnetic field measurement (i.e. a dual differential magnetic field measurement) $V_{dualdiff}=V_{21}-V_{43}$ may be calculated, either inside of the chip or externally by a computing unit. In both cases, the further differential may be calculated by the sensor circuitry 30. In other words, the sensor circuitry may be implemented by the chip or externally in a computing unit. The current strength of the current to be measured may be calculated based on the further differential magnetic field measurement, e.g. based on the formula (as shown in connection with FIGS. 5a and 5b):

$$B_{DUALdiff} = B_{21} - B_{43} = \frac{\mu}{2\pi}\left(\frac{2I_1 W}{(W^2+d^2)} - \frac{I_2(W+R\cos\varphi)}{((W+R\cos\varphi)^2+(R\sin\varphi)^2)} + \frac{I_2(W-R\cos\varphi)}{((W-R\cos\varphi)^2+(R\sin\varphi)^2)} - \frac{2I_1 W}{(W^2+(d+H)^2)} - \frac{I_2(W-R\cos\varphi)}{((W-R\cos\varphi)^2+(H+R\sin\varphi)^2)} + \frac{I_2(W+R\cos\varphi)}{((W+R\cos\varphi)^2+(H+R\sin\varphi)^2)}\right)$$

More details and aspects of the current sensor 400 are mentioned in connection with the proposed concept or one or more examples described above or below (e.g. FIGS. 3, 5a to 6). The current sensor 400 may comprise one or more additional optional features corresponding to one or more aspects of the proposed concept or one or more examples described above or below.

Figure 5A:
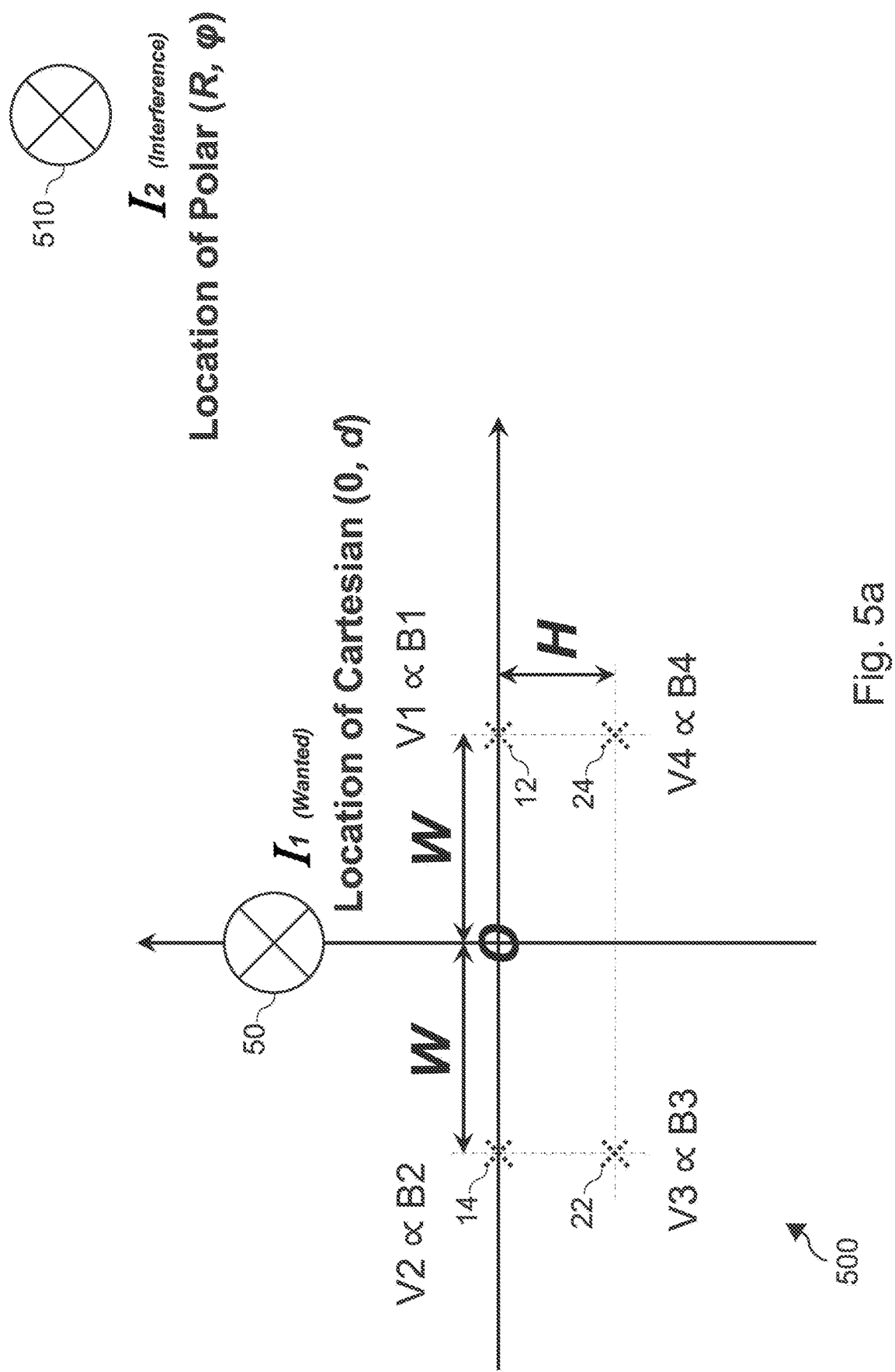
FIGS. 5a and 5b show a schematic cross section of a further embodiment of a current sensor, in which a conductor carrying the current to be measured is conducted is shown.
Figure 5B:
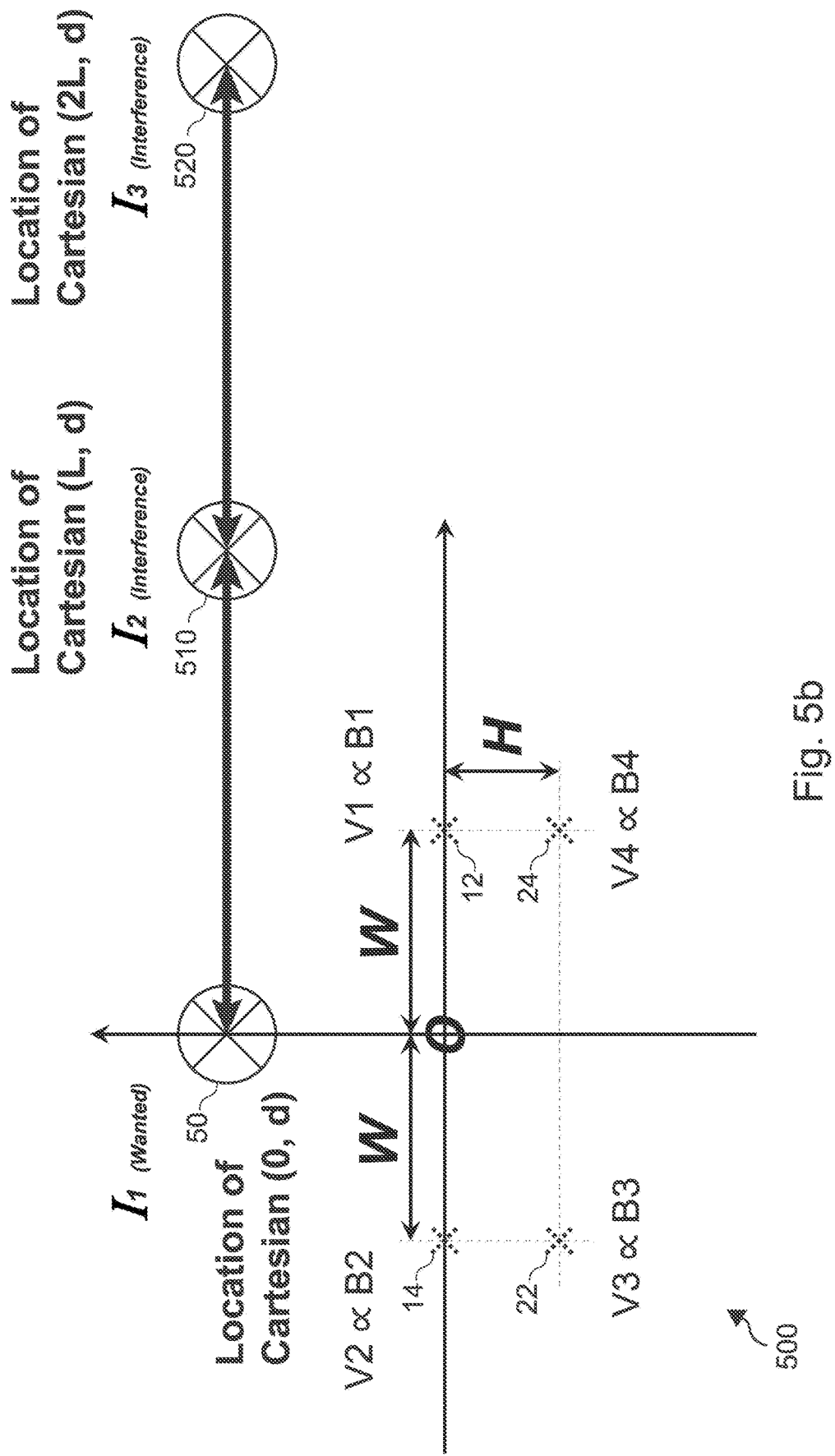

In FIGS. 5a and 5b, a further embodiment of a current sensor 500 is shown. The current sensor 500 may be implemented similar to at least one of current sensors 300 and 400. In FIGS. 5a and 5b, the arrangement of magnetic sensing probes 12; 14; 22 and 24 is shown within a coordinate system. Furthermore, a conductor 50 is shown, and an interference source 510, which may be a further conductor. The interference is caused by electric current $I_2$ flowing through the further conductor 510. A lateral distance between the magnetic sensing probes and conductor 50 is W, and a horizontal distance between the magnetic sensing probes of the different groups is H.

In FIGS. 5a and 5b, the conductor 50 is located at Cartesian(0, d), i.e. at the vertical center line with distance d from the first group of magnetic sensing probes 12; 14. The location of the interference source 510 is given in polar coordinates(R, φ) in FIG. 5a, and in Cartesian coordinates (L, d) in FIG. 5b. For the sake of simplicity, in FIG. 5b, the vertical distance between the further conductor 510 and the magnetic sensing probes 12; 14 of the first group is the same (d) vertical distance between the conductor 50 and the magnetic sensing probes 12; 14 of the first group, and a lateral distance between the further conductor 510 and the conductor 50 is L. FIG. 5b further shows another conductor 520, which is used to conduct current $I_3$, at Cartesian location (2L, d). In FIGS. 5a and 5b, the electric current to be measured is electric current $I_1$ flowing through conductor 50. In other embodiments, other relative locations may apply, e.g. the vertical and lateral location of the interference sources may be independent from the location of the conductor 50.

As shown in FIGS. 5a and/or 5b, the first group 10 of magnetic sensing probes may be arranged vertically between the conductor 50 and the second group 20 of magnetic sensing probes. The conductor may be arranged laterally (e.g. laterally centered) between the magnetic sensing probes of the first and second group of magnetic sensing probes. In some embodiments, the conductor 50 passes through the package 40. For example, the conductor 50 may be arranged (within the package) vertically between the first group 10 of magnetic sensing probes and the second group 20 of magnetic sensing probes. Alternatively, the first group of magnetic sensing probes may be arranged vertically between the conductor 50 and the second group of magnetic sensing probes. Alternatively, the conductor 50 may be arranged outside the package 40 (e.g. separate from the current sensor). In this case, the first group of magnetic sensing probes may be arranged vertically between the conductor 50 and the second group of magnetic sensing probes. In any case, terms "first group" and "second group" may be interchangeable. Accordingly, the second group of magnetic sensing probes may be arranged vertically between the conductor 50 and the first group of magnetic sensing probes.

In the following, the magnetic flux density B is used for calculations, which is proportional to the voltage measured using the magnetic sensing probes within an operating range of the current sensor. Accordingly, the magnetic field flux measured using magnetic sensing probe 12 may be denoted $B_1$, the magnetic field flux measured using magnetic sensing probe 14 may be denoted $B_2$, and the first differential magnetic field measurement may be denoted $B_{21}$. The magnetic field flux measured using magnetic sensing probe 22 may be denoted $B_3$, the magnetic field flux measured using magnetic sensing probe 24 may be denoted $B_4$, and the second differential magnetic field measurement may be denoted $B_{43}$. The differential magnetic field within the two magnetic sensing probes within the same group may yield $B_{21}=B_2-B_1$ and $B_{43}=B_4-B_3$. The differential magnetic field among the two groups may be determined as $B_{DUALdiff}=B_{21}-B_{43}$. $B_{DUALdiff}$ may be used to determine $I_1$ (the current strength of the current to be measured), if the values of W, d, R, φ and $I_2$ are known, using the following formula:

$$B_{DUALdiff} = B_{21} - B_{43} = \frac{\mu}{2\pi}\left(\frac{2I_1 W}{(W^2+d^2)} - \frac{I_2(W+R\cos\varphi)}{((W+R\cos\varphi)^2+(R\sin\varphi)^2)} + \frac{I_2(W-R\cos\varphi)}{((W-R\cos\varphi)^2+(R\sin\varphi)^2)} - \frac{2I_1 W}{(W^2+(d+H)^2)} - \frac{I_2(W-R\cos\varphi)}{((W-R\cos\varphi)^2+(H+R\sin\varphi)^2)} + \frac{I_2(W+R\cos\varphi)}{((W+R\cos\varphi)^2+(H+R\sin\varphi)^2)}\right)$$

If W is much smaller than R (W<<R) and His much smaller than R (H<<R), i.e. if the lateral distance and the vertical distance among the hall probes is much smaller than the distance between the hall probes and the source of interference, $B_{DUALdiff}$ may be approximated by $$B_{DUALdiff} \approx \frac{\mu I_1}{\pi}\left(\frac{W}{(W^2+d^2)} - \frac{W}{(W^2+(d+H)^2)}\right)$$

so that $I_1$ (the current to be measured) can be determined using $B_{DUALdiff}$ and the constant values of W, d and H. In $B_{DUALdiff}$ the interference that causes the stray magnetic field is deeply suppressed.

Embodiments of a current sensor comprising four magnetic sensing probes were evaluated. A signal level at the 4 magnetic sensing probes was measured, where the current to be measured amounted to 50 Å, and the interference was caused by 500 Å of current running through a conductor at a distance of 20 cm. Single differential signals $B_{21}$ and $B_{43}$ and dual differential signal $(B_{21}-B_{43})$ were calculated. It was shown that with dual differential operation, the interference current generated less influence at the sensor output as $B_{DUALdiff}=B_{21}-B_{43}$ over 360 degree position angle range. The ripple of $B_{DUALdiff}$ was in the range of 1% to 6% of the ripple of either $B_{21}$ or $B_{43}$. By using a differential operation $(B_{DUALdiff}=B_{21}-B_{43})$ on the differential measurement results ($B_{21}$ and $B_{43}$), a deeper stray magnetic field suppression was achieved.

Accordingly, a significant interference reduction compared to single differential current sensing was obtained, which increases sensor output signal SNR. Additionally, a higher sensor signal availability due to full redundancy where during fault of one die, reduced operation is possible by another symmetric die signal. Due to higher stray field robustness, inter-Bus-Bar calibration in high current application may be eliminated. Furthermore, no complicated calibration procedure may be required.

At least some embodiments of the present disclosure may be implemented at the integrated circuit level, i.e. the sensor circuitry may be implemented in a single semiconductor device. On device level, four magnetic sensing probes in an integrated circuit with each pair of two magnetic sensing probes measuring differential magnetic field and the measured differential magnetic field may be further operated with a differential process to derive the final result, where the second differential process can happen either on the said integrated circuit or out of the integrated circuit in a higher level computing unit.

Alternatively, the embodiments may be implemented on a module level (i.e. two differential current sensors may be combined to form the current sensor of embodiments), which may enable a re-use of components (at slightly lower levels of stray field suppression). On current sensing module level, four magnetic sensing probes may generate a pair of differential signals with further differential on the said pair of differential signals as final output.

Embodiments may be applied to both IC development and current sensor module design and even with four individual mono Hall current sensors. Using embodiments, a more precise and robust current measurement may be achieved.

In applications where multiple conductors are arranged in close proximity to each other, embodiments may be used to mitigate the effects of cross talk. As crosstalk effects in dual differential current sensing (according to at least some embodiments) are insignificant as compare to single differential current sensor, a calibration of the current sensor may be facilitated as only the current sensor transfer function might be calibrated.

Embodiments may provide a current measurement method with an interference suppression feature by using four magnetic sensing probes. Embodiments may further provide a current measurement method with a redundancy feature by using four magnetic sensing probes. In either of the current measurement methods, the four magnetic sensing probes may be placed onto two separate vertically stacked dies inside of an integrated circuit device with each die containing two magnetic sensing probes. Each magnetic sensing probe on the same die may be horizontally aligned. Each magnetic sensing probe may be vertically aligned to the corresponding magnetic sensing probe on another die. Embodiments may further provide an integrated circuit device that provides the differential magnetic field strength measured by the magnetic sensing probes using either of the current measurement methods. Embodiments further provide an integrated circuit device that provides the differential magnetic field strength measured by the magnetic sensing probes on different dies using either of the current measurement methods.

More details and aspects of the current sensor 500 are mentioned in connection with the proposed concept or one or more examples described above or below (e.g. FIG. 3, 4 or 6). The current sensor 500 may comprise one or more additional optional features corresponding to one or more aspects of the proposed concept or one or more examples described above or below.

Figure 6:
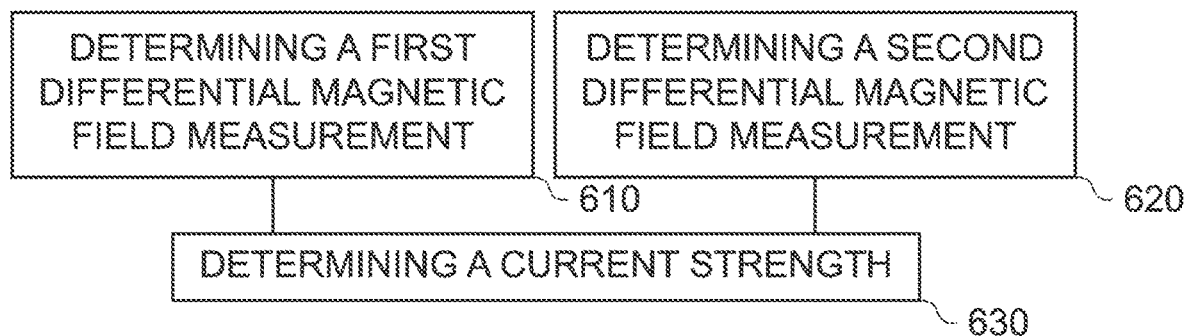
FIG. 6 shows a flow chart of an embodiment of a method for sensing a strength of an electric current.

FIG. 6 shows a flow chart of an embodiment of a method for sensing a strength of an electric current. The method comprises determining 610 a first differential magnetic field measurement of a magnetic field using probes 12; 14 of a first group 10 of magnetic sensing probes. The magnetic field is caused by an electric current to be measured. The method comprises determining 620 a second differential magnetic field measurement of the magnetic field using probes 22; 24 of a second group 20 of magnetic sensing probes. The method comprises determining 630 a strength of the electric current to be measured based on a difference between the first differential magnetic field measurement and the second differential magnetic field measurement.

More details and aspects of the method are mentioned in connection with the proposed concept or one or more examples described above or below (e.g. FIGS. 3 to 5*b*). The method may comprise one or more additional optional features corresponding to one or more aspects of the proposed concept or one or more examples described above or below.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A current sensor for sensing a strength of an electric current, the current sensor comprising:
    a first group of magnetic sensing probes comprising a first magnetic sensing probe and a second magnetic sensing probe, wherein the first magnetic sensing probe and the second magnetic sensing probe each have a vertical center aligned along a first horizontal line and each have a horizontal center separated by a first horizontal distance along the first horizontal line;
    a second group of magnetic sensing probes comprising a third magnetic sensing probe and a fourth magnetic sensing probe, wherein the third magnetic sensing probe and the fourth magnetic sensing probe each have a vertical center aligned along a second horizontal line and each have a horizontal center separated by the first horizontal distance along the second horizontal line,
    wherein the first and the second horizontal lines are parallel lines that are separated by a first vertical distance,
    wherein the horizontal centers of the first magnetic sensing probe and the third magnetic sensing probe are aligned along a first vertical line, and
    wherein the horizontal centers of the second magnetic sensing probe and the fourth magnetic sensing probe are aligned along a second vertical line that is parallel to the first vertical line; and
    sensor circuitry coupled to the first group of magnetic sensing probes and to the second group of magnetic sensing probes, wherein the sensor circuitry:
    determines a first differential magnetic field measurement of a magnetic field using the first and the second magnetic sensing probes of the first group of magnetic sensing probes, the magnetic field being produced by an electric current to be measured;
    determines a second differential magnetic field measurement of the magnetic field using the third and the fourth magnetic sensing probes of the second group of magnetic sensing probes;
    determines a dual differential magnetic field measurement as a difference between the first differential magnetic field measurement and the second differential magnetic field measurement; and
    determines a strength of the electric current based on the dual differential magnetic field measurement.

2. The current sensor according to claim 1, wherein the first magnetic sensing probe generates a first sensor value responsive to the magnetic field, the second magnetic sensing probe generates a second sensor value responsive to the magnetic field, the third magnetic sensing probe generates a third sensor value responsive to the magnetic field, the fourth magnetic sensing probe generates a fourth sensor value responsive to the magnetic field, and
    wherein the sensor circuitry determines the first differential magnetic field measurement by subtracting the second sensor value from the first sensor value and determines the second differential magnetic field measurement by subtracting the third sensor value from the fourth sensor value.

3. The current sensor according to claim 1, wherein the first group of magnetic sensing probes is implemented in a first die, and wherein the second group of magnetic sensing probes is implemented on a second die.

4. The current sensor according to claim 3, wherein the magnetic sensing probes of the first group of magnetic sensing probes are disposed laterally spaced from each other on the first die, and wherein the magnetic sensing probes of the second group of magnetic sensing probes are disposed laterally spaced from each other on the second die.

5. The current sensor according to claim 4, wherein the first die and the second die are arranged vertically adjacent to each other.

6. The current sensor according to claim 4, wherein the first and the second die are stacked on top of each other.

7. The current sensor according to claim 3, wherein the first die and the second die are arranged at opposite sides of a substrate of a package of the current sensor.

8. The current sensor according to claim 1, wherein the first group of magnetic sensing probes and the second group of magnetic sensing probes are implemented on the same die.

9. The current sensor according to claim 1, wherein the electric current to be measured is an electric current flowing through a primary conductor, wherein the first group of magnetic sensing probes is arranged vertically between the primary conductor and the second group of magnetic sensing probes, and wherein the primary conductor is arranged laterally between the magnetic sensing probes of the first group of magnetic sensing probes and laterally between the magnetic sensing probes of the second group of magnetic sensing probes.

10. The current sensor according to claim 1, wherein the current sensor comprises a package comprising the first group of magnetic sensing probes, the second group of magnetic sensing probes, and the sensor circuitry.

11. The current sensor according to claim 10, wherein the electric current to be measured is an electric current flowing through a primary conductor, wherein the primary conductor passes through the package.

12. The current sensor according to claim 10, wherein the electric current to be measured is an electric current flowing through a primary conductor, wherein the primary conductor is arranged outside the package.

13. The current sensor according to claim 1, wherein a first probe of the first group of magnetic sensing probes is laterally aligned with a first probe of the second group of magnetic sensing probes, and wherein a second probe of the first group of magnetic sensing probes is laterally aligned with a second probe of the second group of magnetic sensing probes.

14. The current sensor according to claim 1, wherein each magnetic sensing probe of the first group of magnetic sensing probes is vertically aligned with a magnetic sensing probe of the second group of magnetic sensing probes.

15. A method for sensing a strength of an electric current, the method comprising:
   determining a first differential magnetic field measurement of a magnetic field using first and second magnetic sensing probes of a first group of magnetic sensing probes, the magnetic field being produced by the electric current;
   determining a second differential magnetic field measurement of the magnetic field using third and fourth magnetic sensing probes of a second group of magnetic sensing probes;
   determining a dual differential magnetic field measurement as a difference between the first differential magnetic field measurement and the second differential magnetic field measurement; and
   determining a strength of the electric current based on the dual differential magnetic field measurement,
   wherein the first magnetic sensing probe and the second magnetic sensing probe each have a vertical center aligned along a first horizontal line and each have a horizontal center separated by a first horizontal distance along the first horizontal line,
   wherein the third magnetic sensing probe and the fourth magnetic sensing probe each have a vertical center aligned along a second horizontal line and each have a horizontal center separated by the first horizontal distance along the second horizontal line,
   wherein the first and the second horizontal lines are parallel lines that are separated by a first vertical distance,
   wherein the horizontal centers of the first magnetic sensing probe and the third magnetic sensing probe are aligned along a first vertical line, and
   wherein the horizontal centers of the second magnetic sensing probe and the fourth magnetic sensing probe are aligned along a second vertical line that is parallel to the first vertical line.

16. The current sensor according to claim 1, wherein the sensor circuitry determines the strength of the electric current based on the dual differential magnetic field measurement and the first horizontal distance.

17. The current sensor according to claim 1, wherein the sensor circuitry determines the strength of the electric current based on the dual differential magnetic field measurement, the first horizontal distance, and the first vertical distance.

18. The current sensor according to claim 1, wherein the electric current to be measured is an electric current flowing through a primary conductor that has a horizontal center arranged on a vertical center line that extends parallel to and between the first and the second vertical lines, wherein the first and the second vertical lines are spaced apart from the vertical center line by equal distances, the sum of which is equal to the first horizontal distance.

19. The current sensor according to claim 18, wherein the primary conductor extends in a current flow direction of the electric current that is orthogonal to both the vertical center line and to the first horizontal line.

20. The current sensor according to claim 18, wherein the primary conductor has a vertical center arranged at a second vertical distance from the first horizontal line, and the sensor circuitry determines the strength of the electric current based on the dual differential magnetic field measurement, the first horizontal distance, the first vertical distance, and the second vertical distance.

21. The current sensor according to claim 18, wherein:
   an interfering conductor conducts an interfering electric current that produces an interfering magnetic field,
   the primary conductor has a vertical center arranged at a second vertical distance from the first horizontal line, and
   the sensor circuitry determines the strength of the electric current based on the dual differential magnetic field measurement, the first horizontal distance, the second vertical distance, and a current value of the interfering electric current.

22. The current sensor according to claim 21, wherein the sensor circuitry determines the strength of the electric current based on the dual differential magnetic field measurement, the first horizontal distance, the second vertical distance, the current value of the interfering electric current, and polar coordinates of the interfering conductor relative to an intersection of the center vertical line and the first horizontal line.

* * * * *